(12) United States Patent
Yamamoto

(10) Patent No.: US 6,861,280 B2
(45) Date of Patent: Mar. 1, 2005

(54) IMAGE SENSOR HAVING MICRO-LENSES WITH INTEGRATED COLOR FILTER AND METHOD OF MAKING

(75) Inventor: Katsumi Yamamoto, Shanghai (CN)

(73) Assignee: OmniVision International Holding Ltd (KY)

( * ) Notice: Subject to any disclaimer, the term of this patent is extended or adjusted under 35 U.S.C. 154(b) by 0 days.

(21) Appl. No.: 10/280,399

(22) Filed: Oct. 25, 2002

(65) Prior Publication Data

US 2004/0080008 A1 Apr. 29, 2004

(51) Int. Cl.7 .................................................. H01L 21/00
(52) U.S. Cl. ........................................ 438/70; 257/98
(58) Field of Search .............................. 438/48, 57, 65, 438/70, 73, 78; 257/79, 98, 233, 435, 432, 292, 291

(56) References Cited

U.S. PATENT DOCUMENTS

| 5,336,367 A | * | 8/1994 | Nomura .................. 438/70 |
| 6,261,861 B1 | | 7/2001 | Pai et al. |
| 6,274,917 B1 | | 8/2001 | Fan et al. |
| 6,297,071 B1 | | 10/2001 | Wake |
| 6,362,513 B2 | | 3/2002 | Wester |
| 6,436,851 B1 | | 8/2002 | Young et al. |
| 2001/0042876 A1 | * | 11/2001 | Wester |

* cited by examiner

*Primary Examiner*—Long Pham
(74) *Attorney, Agent, or Firm*—Perkins Coie LLP

(57) ABSTRACT

An image sensor comprising a plurality of pixels formed in a semiconductor substrate, each pixel including a light sensitive element, and a color filter material formed over the light sensitive element, the color filter material formed in a micro-lens shape.

6 Claims, 5 Drawing Sheets

IMAGE SENSOR HAVING MICRO-LENSES WITH INTEGRATED COLOR FILTER AND METHOD OF MAKING

TECHNICAL FIELD

The present invention relates to image sensors, and more particularly, towards an image sensor that has a combination micro-lens and color filter resulting in a short focal length.

BACKGROUND

Image sensors are electronic integrated circuits that can be used to produce still or video images. Solid state image sensors can be either of the charge coupled device (CCD) type or the complimentary metal oxide semiconductor (CMOS) type. In either type of image sensor, a light gathering pixel is formed in a substrate and arranged in a two-dimensional array. Modern image sensors typically contain millions of pixels to provide a high-resolution image. An important part of the image sensor are the color filters and micro-lens structures formed atop of the pixels. The color filters, as the name implies, are operative, in conjunction with signal processing, to provide a color image. Examples of color filter technology are shown in U.S. Pat. No. 6,297,071 and U.S. Pat. No. 6,274,917 (and the references cited therein). The micro-lenses serve to focus the incident light onto the pixels, and thus to improve the fill factor of each pixel.

Conventionally, micro-lenses are formed by spin coating a layer of micro-lens material onto a planarized layer. The micro-lens material is then etched to form cylindrical or other shaped regions that are centered above each pixel. Then, the micro-lens material is heated and reflowed to form a convex hemispherical micro-lens. FIG. 1 shows a prior art cross-sectional simplified diagram of an image sensor 101 having micro-lenses formed thereon. As seen in FIG. 1, the image sensor includes a plurality of pixels that have light detecting elements 103 formed in the substrate. The light detecting elements 103 may be one of several types, such as a photodiode, a photogate, or other solid state light sensitive element. Formed atop of each pixel is a micro-lens 105. The micro-lens 105 focuses incident light onto the light detecting elements 103. Moreover, in the region between the light detecting elements 103 and the micro-lens 105, denoted by reference numeral 107, there are various intervening layers that would typically include the color filter layers and various metal conducting lines.

The combination of the convex micro-lens and the color filter layer provides a total thickness that would normally require a micro-lens with a relatively long focal length, which can be difficult to manufacture at higher integration densities. Further, the process of forming the micro-lens and the color filter includes many process steps.

DETAILED DESCRIPTION

The present invention relates to a combination micro-lens and color filter structure for use with image sensors, either of the CMOS or CCD type. In the following description, numerous specific details are provided to provide a thorough understanding of the embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout the specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
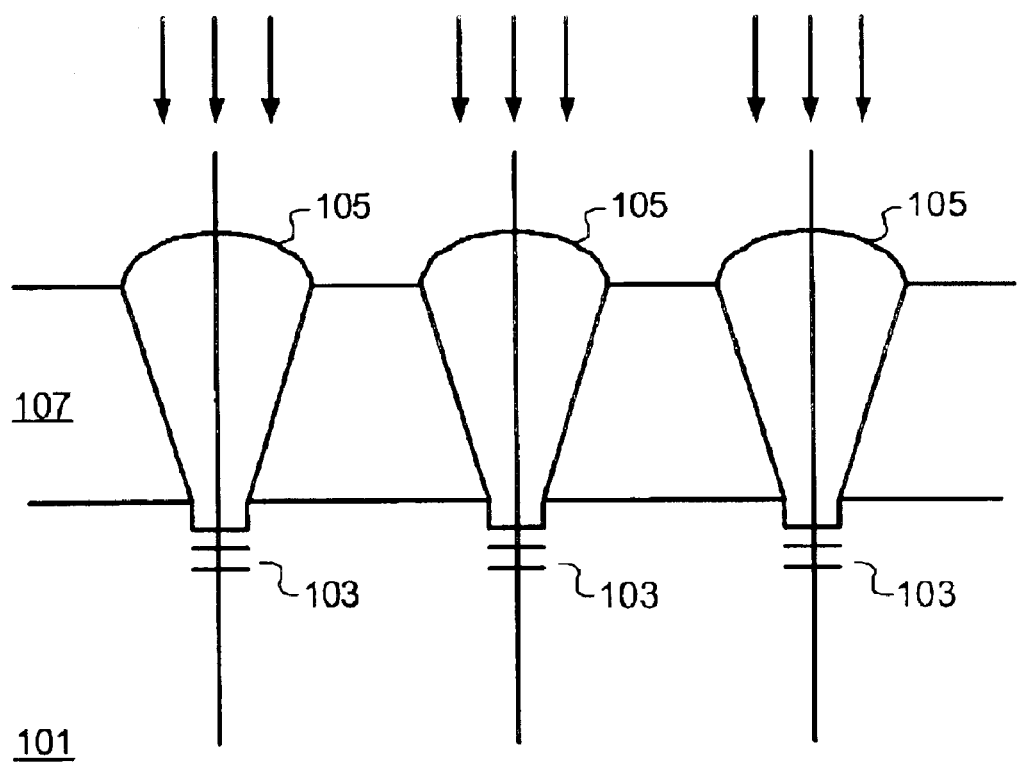
FIG. 1 is a prior art cross sectional view of a portion of an image sensor.
Figure 2:
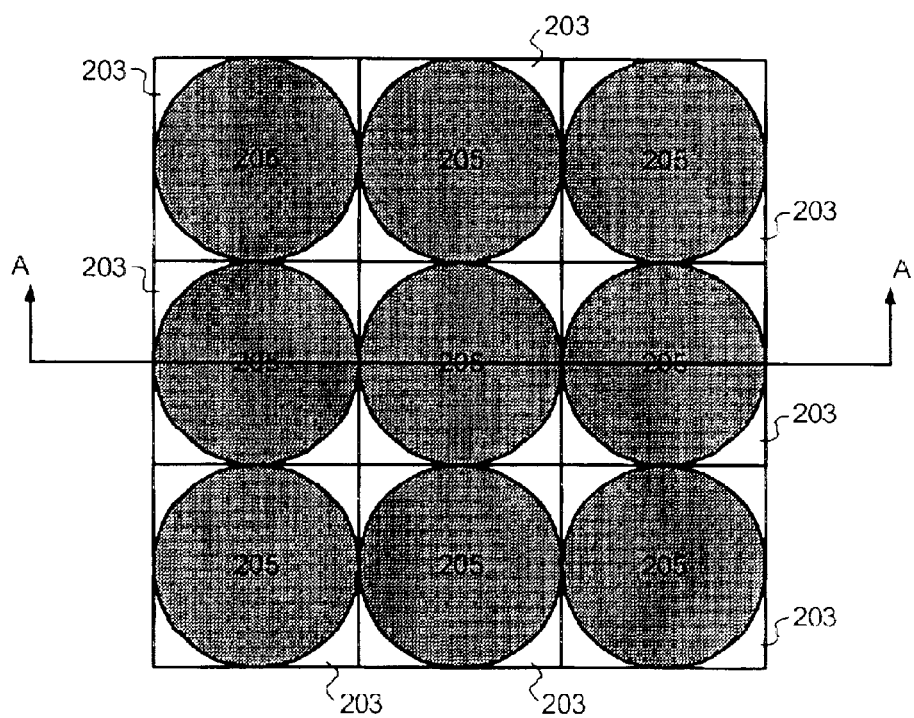
FIG. 2 is a top view of an image sensor showing pixels arranged in a two-dimensional array and with micro-lenses formed thereon.

FIG. 2 shows a top view of an image sensor 201 formed in accordance with the present invention. The image sensor 201 includes a plurality of pixels 203 typically arranged in a two dimensional array. In the example shown in FIG. 2, the image sensor shows a three by three array of pixels 203, though it can be appreciated that an actual image sensor 201 would have many more pixels, arranged in perhaps over a thousand rows and/or a thousand columns. Further, although FIG. 2 shows the pixels in ordered columns and rows, the pixels may be arranged in any type of ordered arrangement. For example, alternating rows may have their pixels slightly offset from each other laterally in a checkerboard format.

The pixels 203 typically include a light sensitive element, such as a photodiode or a photogate as two examples. However, it can be appreciated that other types of light sensitive elements, now known or developed in the future, may be used. Further, the pixels 203 will also include amplification and/or readout circuitry. For clarity, this circuitry is not shown in FIG. 2. In one embodiment, the pixels 203 may be active pixels, commonly known in the prior art. Formed atop of each pixel 203 is a combination micro-lens/color filter 205.

Figure 3:
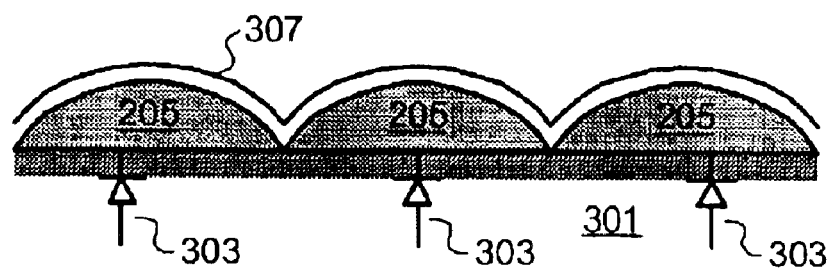
FIGS. 3–7 are cross sectional views of a semiconductor substrate illustrating one method for forming the apparatus of the present invention.

FIGS. 3–7 show in greater detail the formation and structure of the combination micro-lens/color filter 205 of the present invention. Specifically, FIG. 3 is a cross-sectional view taken along line A—A of FIG. 2. A semiconductor substrate 301 has a plurality of light sensitive elements 303 (associated with the pixels 203 of FIG. 2) formed therein. FIG. 3 shows the light sensitive element 303 as a photodiode, though other substitutes and equivalents may be used. Details of forming the photodiode and other associated circuitry are known in the prior art and will not be repeated herein to avoid obscuring the present invention. However, examples of the prior art may be seen in U.S. Pat. No. 5,904,493 and U.S. Pat. No. 6,320,617.

Formed atop of the light sensitive elements 303 are the combination micro-lens/color filter 205. The micro-lens/color filter 205 is a color filter that is formed into the shape of a micro-lens. In such a manner, by combining the color filter and the micro-lens into a single integrated structure, the combined thickness is lowered. Other advantages of this combined structure, as one example manufacturing ease and cost, are gained. Further, after formed atop of the micro-lens/color filter 205 is a passivation layer 307. The passivation layer 307 protects the micro-lens/color filter 205 from damage.

Figure 4:
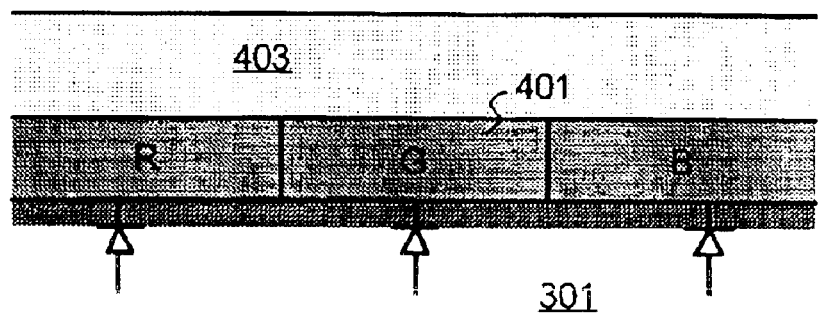

Turning to FIG. 4, in accordance with one embodiment of the present invention, a planar color filter layer 401 is deposited over the substrate 301 and light sensitive elements 303. It should be noted that while in this particular embodiment, the color filter layer 401 is formed directly over the substrate 301, in other embodiments, the color filter layer 401 is formed over an intermediate layer or layers, depending upon the particular process used. For example, in some instances, a planarizing dielectric layer is formed over the substrate, or in other instances, conductive metal layers and insulating layers are formed over the substrate.

The color filter layer 401 is composed of three separate color layers that have been patterned and etched to form the color filter layer 401. In one embodiment, the color filter layer 401 includes red, green, and blue colors. In another embodiment, the color filter layer 401 includes yellow, cyan, and magenta colors. The color filter layer 401 is formed from a pigmented or dyed material that will only allow a narrow band of light to pass therethrough, for example, red, blue, or green. In other embodiments, the color filter may be cyan, yellow, or magenta. These are but example colors for the color filter layer 401 and the present invention is meant to encompass a color filter layer 401 having any combination of color.

Further, while the use of pigmented or dyed color materials is the most prevalent form of color filters, other reflective type color filters may be used, such as a multilayer stack reflective material. The formation of color filter layer 401 is known in art and will not be described herein to avoid any unnecessary obscuration with the description of the present invention. For example, U.S. Pat. No. 6,297,071, U.S. Pat. No. 6,362,513, and U.S. Pat. No. 6,271,900 show the current state of the color filter art.

Typically, the color filter layer 401 is formed from a material such as an acrylic. For example, a suitable material is polymethylmethacrylate (PMMA) or polyglycidyl-methacrylate (PGMA) that has been pigmented or dyed. Other photoresist-type materials that can be dyed or pigmented may also be used for the color filter layer 401.

Still referring to FIG. 4, after the color filter layer 401 has been formed using conventional means, a sacrificial layer 403 is formed. The sacrificial layer 403 may be formed using a blanket deposition process, or alternatively, using a spin on method. In one embodiment, the sacrificial layer 403 is a photoresist, epoxy, or an acrylic. One example of a suitable material is polymethylmethacrylate (PMMA) or polyglycidyimethacrylate (PGMA) or any photoresist material. In one embodiment, the sacrificial layer 403 is a phenyl.

Figure 5:
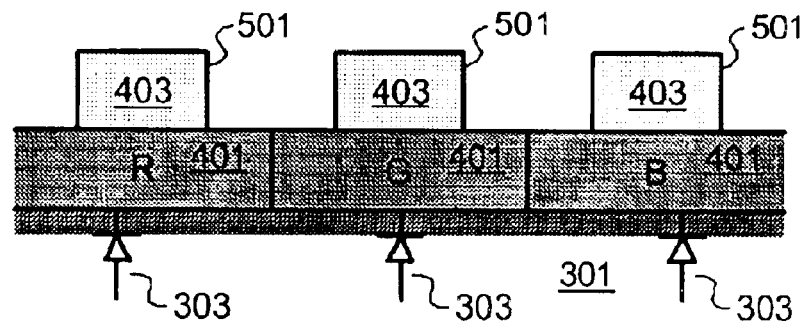

Next, turning to FIG. 5, the sacrificial layer 403 is patterned to form blocks 501 of sacrificial layer 403. The blocks 501 are generally formed over the light sensitive elements 303. In one embodiment, the blocks 501 are of cylindrical shape, but may be square, rectangular, or any other shape, so long as the light sensitive elements 303 are covered.

In the case where the sacrificial layer 403 is a photoresist, the patterning process can be simply done by a photolithography and development step. However, if the sacrificial layer 403 is not a photoresist, a patterning and etching process using conventional photolithography and photoresist may be used.

In one embodiment, the thickness of the sacrificial layer 403 is on the order of 0.1 to 1 microns. However, thinner or thicker layers of the sacrificial layer 403 may also be used, depending on various design parameters, such as desired focal length of the combination micro-lens/color filter 205.

The specific shape and dimensions of the blocks 501 shown in FIG. 5 is but one specific embodiment of the present invention. Other implementations are possible. For example, the size of the blocks 501 shown in FIG. 5 may be made smaller or larger depending upon the desired size of the micro-lenses to be formed.

Figure 6:
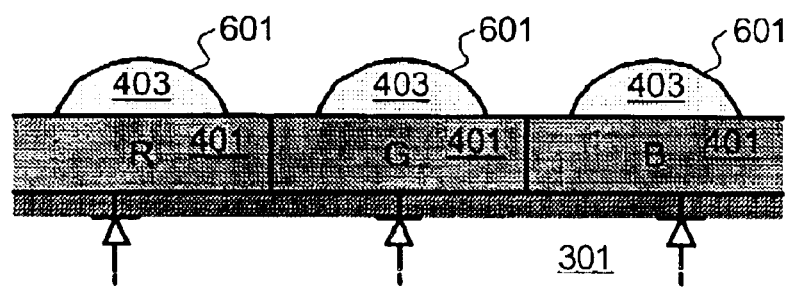

Turning to FIG. 6, once the sacrificial layer 403 has been developed (in the case of the sacrificial layer 403 being a photoresist) or etched (in the case of a non-photoresist sacrificial layer), the blocks 501 are heated to a reflow temperature. This causes the blocks 501 to adopt a minimum surface tension shape, which in many cases results in spherical drops 601.

Figure 7:
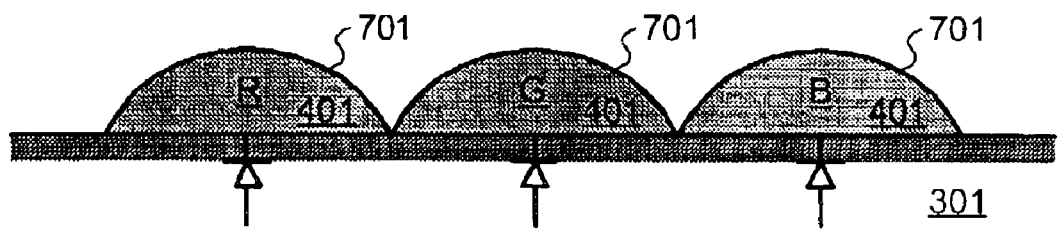

Once the reflow process has been finished, an anisotropic dry etch is performed using the spherical drops 601 as an etching mask. In one embodiment, the etch is a reactive ion etch using O2 as the primary gas and CH3 as a secondary gas. In one embodiment, the etching ratio between the color filter layer 401 and the sacrificial layer 403 is on the order of 0.8 to 1.5. In one embodiment, the etching process is complete when the sacrificial layer 403 is removed. Because of the spherical drops 601, the result of the dry etch is a transfer of the shape of the spherical drops to the color filter layer 401 to form a combination micro-lens/color filter 701 over each light sensitive element 303. The result is seen in FIG. 7.

It should be noted that the spacing between adjacent micro-lenses/color filters can be varied by controlling the spacing and shape of the spherical drops 601. It can be appreciated that the size and shape of the spherical drops 601, the etching length, the composition of the color filter material 401 and sacrificial layer 403, and other process/design factors can be varied to achieve the desired result for the characteristics of the micro-lenses/color filters.

Next, returning to FIG. 3, an optional passivation layer 307 is applied atop of the micro-lens/color filters 205. The passivation layer 307 serves dual purposes. First, because the etching process may damage the color filter material 401, repair may be necessary. Second, the passivation layer 307 may also serve to protect the color filter material 401. In any event, the term passivation layer 307 as used herein refers to any material that can accomplish any of the above goals. In one embodiment, the passivation layer 307 is an acrylic, such as PMMA, which has a molecular number of between 50,000 and 200,000. The application of PMMA can be done in any known manner.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A method of forming a pixel of an image sensor comprising:

forming a light sensitive element in a semiconductor substrate;

forming a color filter material over said light sensitive element;

forming a spherical drop over said color filter material and over said light sensitive element, said spherical drop formed from a sacrificial material; and etching said color filter material using said spherical drop as a mask, such that said color filter material mimics the shape of said spherical drop after etching and becomes a micro-lens shape.

2. The method of claim 1 wherein said color filter material is selected from the group of red color filter material, green color filter material, and blue color filter material.

3. The method of claim 1 further including a color filter material is selected from the group of cyan color filter material, yellow color filter material, and magenta color filter material.

4. The method of claim 1 wherein the color filter material is pigmented or dyed polymethylmethacrylate (PMMA) or polyglycidylmethacrylate (PGMA).

5. The method of claim 1 further including forming a passivation layer over said color filter material.

6. The method of claim 5 wherein said passivation layer has a molecular number of between 50,000 and 200,000.

* * * * *